(12) United States Patent
Tsuda

(10) Patent No.: US 7,764,144 B2
(45) Date of Patent: Jul. 27, 2010

(54) ELASTIC WAVE FILTER WITH TAPERED IDT ELECTRODES

(75) Inventor: Tadaaki Tsuda, Sayama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 178 days.

(21) Appl. No.: 12/284,668

(22) Filed: Sep. 24, 2008

(65) Prior Publication Data
US 2009/0085692 A1 Apr. 2, 2009

(30) Foreign Application Priority Data
Sep. 28, 2007 (JP) ............... 2007-256036

(51) Int. Cl.
H03H 9/64 (2006.01)
H03H 9/145 (2006.01)

(52) U.S. Cl. .................... 333/195; 310/313 D

(58) Field of Classification Search ......... 333/193–196; 310/313 B, 313 D
See application file for complete search history.

(56) References Cited

U.S. PATENT DOCUMENTS

| | | | | |
|---|---|---|---|---|
| 3,999,153 A | * | 12/1976 | Borner | 333/195 |
| 4,600,905 A | * | 7/1986 | Fredricksen | 333/196 |
| 4,749,971 A | * | 6/1988 | Solie | 333/153 |
| 4,878,036 A | * | 10/1989 | Yatsuda et al. | 333/195 |
| 4,973,875 A | * | 11/1990 | Yatsuda | 310/313 D |
| 5,289,073 A | * | 2/1994 | Mariani | 310/313 D |
| 5,831,492 A | * | 11/1998 | Solie | 333/193 |
| 6,023,122 A | * | 2/2000 | Liu et al. | 310/313 B |
| 7,023,300 B2 | * | 4/2006 | Jian et al. | 333/195 |
| 7,400,218 B2 | | 7/2008 | Kidoh | |
| 2005/0099247 A1 | * | 5/2005 | Kidoh | 333/193 |
| 2005/0200233 A1 | * | 9/2005 | Kando | 310/313 D |
| 2010/0102901 A1 | * | 4/2010 | Tsuda | 333/195 |

FOREIGN PATENT DOCUMENTS

| | | | | |
|---|---|---|---|---|
| JP | 64-82705 | * | 3/1989 | 333/200 |
| JP | 03-83408 | * | 4/1991 | 310/313 B |
| JP | 2005-150918 | | 6/2005 | |

* cited by examiner

Primary Examiner—Barbara Summons
(74) Attorney, Agent, or Firm—Jordan and Hamburg LLP

(57) ABSTRACT

In an elastic wave filter in which an IDT is configured in a tapered shape, an object of the present invention is to provide a technology capable of suppressing deterioration of attenuation characteristics due to refraction and the like of the elastic wave and also suppressing loss. Then, an input side area adjacent to an input side tapered IDT electrode of this short grating electrode and an output side area close to an output side tapered IDT electrode are made patterns continuous (as if extended) from the input side tapered IDT electrode and the output side tapered IDT electrode respectively. The areas between the input side tapered IDT electrode, the output side tapered IDT electrode and the short grating electrode are set in a manner that the cycle unit λ which is a repeating unit of the electrode fingers is continued without breaking.

6 Claims, 15 Drawing Sheets

ELASTIC WAVE FILTER WITH TAPERED IDT ELECTRODES

BACKGROUND OF THE INVENTION

1. Field of the Invention

The present invention relates to an elastic wave filter, for instance, a SAW (SAW: Surface Acoustic Wave) filter.

2. Description of the Related Art

A SAW device makes good use of surface acoustic waves and by arranging electrode fingers called an inter-digital transducer (IDT) above a piezoelectric substrate, and performing an electromechanical interconversion between an electric signal and an elastic wave, so as to have frequency selection (band filter) characteristics. The surface acoustic wave (SAW) filter, one of the SAW devices is used as a band-pass filter for various communication devices such as a cellular phone or the like, for which sophistication in performance and miniaturization have been proceeding. In recent years, with an advance of speeding up and enlarging capacity of wireless data communication, demands for a smaller insertion loss (attenuation amount of output power against input power), excellent filter characteristics in frequency selectivity, a broader band width, an increase in flatness, and in realizing miniaturization have been growing. In order to satisfy these demands, it is advantageous to use, for instance, a tapered IDT filter.

Such a filter 100 is provided with an input side tapered IDT electrode 102 and an output side tapered IDT electrode 103, which are tapered electrodes formed above a piezoelectric substrate 101, as shown, for instance, in FIG. 13, and is configured such that the elastic waves propagate from the input side tapered IDT electrode 102 side toward the output side tapered IDT electrode 103 side. A shield 104 to suppress coupling between the electrodes 102 and 103 is provided between these electrodes 102 and 103, and the shield 104 is formed as a square-shaped planar metal film (so-called solid film).

The respective electrodes 102 and 103 are composed of two parallel bus bars 105 having a plurality of electrode fingers 106, and are configured as a SPLIT electrode, by facing the electrode fingers 106 each other, connected to the bus bars 105, and by making up the electrode fingers 106 be sets of, for instance, pairs and extending alternately from the opposite side to be in a shape of comb teeth in the respective electrodes 102 and 103.

In each of the electrodes 102 and 103, the electrode finger 106 is formed so that the widths of the electrode fingers 106 become uniform along the direction of propagation of the elastic wave and the spaces between the electrode fingers 106 and 106 also become uniform. An arrangement pattern composed of the width of the electrode finger 106 and the space between the electrode fingers 106 and 106 is set in a manner that a cycle unit $\lambda$ of a certain length is repeated. In this instance, one cycle unit $\lambda$ is composed by four electrode fingers 106 and the space areas between these electrode fingers 106.

Accordingly, in this filter 100, the elastic wave having a wavelength the same as the cycle unit $\lambda$ is to be propagated from the input side tapered IDT electrode 102 toward the output side tapered IDT electrode 103.

The length of the cycle unit $\lambda$ is set in a manner that it is gradually widened from one bus bar 105 toward the other bus bar 105 in the direction perpendicular to the direction of propagation of the elastic wave, in other words, the width of the electrode finger 106 and the space between electrode fingers 106 and 106 are gradually widened respectively.

By configuring the tapered IDT by gradually widening the arrangement pattern of the electrode fingers 106 in the manner described above, the elastic waves having a range from a high frequency in which the cycle unit $\lambda$ corresponds to a narrow area to a low frequency in which the cycle unit $\lambda$ corresponds to a wide area, are propagated in the filter 100, which results in realization of widening band width of the filter 100.

In the meantime, when the arrangement pattern of the electrode finger 106 is gradually widened, an inclination angle $\theta$ formed between the electrode finger 106 and the direction of propagation of the elastic wave is getting increased. Furthermore, when a difference in length of the cycle unit $\lambda$ between the cycle unit $\lambda$ corresponding to the narrow area and the cycle unit $\lambda$ corresponding to the wide area is taken large for the purpose of further widening the band width of propagating frequency in the filter 100, the inclination is further increased.

By the way, a difference in a state of propagation (propagation speed) of the elastic wave above the piezoelectric substrate 101 is created between a part where the input side tapered IDT electrode 102 and the output side tapered IDT electrode 103 exist and a part where no existence of the input side tapered IDT electrode 102 and the output side tapered IDT electrode 103. Then, the elastic wave is refracted when radiated from the end of the input side tapered IDT electrode 102 on the output side tapered IDT electrode 103 side. Accordingly, when the inclination angle $\theta$ of the electrode finger 106 is increased thus, the elastic wave propagated from the input side IDT electrode 102 launches into the output side tapered IDT electrode 103, largely shifted from a track being a propagation path where the cycle unit $\lambda$ corresponding to its wavelength is formed.

When two kinds of the elastic waves, for instance, Tr 1 (low frequency side) and Tr 2 (high frequency side) are radiated from tracks where cycle units $\lambda$ corresponding to respective frequencies in the input side tapered IDT electrode 102 are formed, toward the output side tapered IDT electrode 103 side in such a filter 100, FIG. 14 shows an energy distribution (right hatching in the drawing) in the case of just receiving the elastic wave transmitted from the respective tracks without shifting from the track and an energy distribution (left hatching in the drawing) in the case of receiving with shifting from the track. From FIG. 14, it is found that the energy received at the output side tapered IDT electrode 103 is reduced due to refraction in all tracks in either side of the low frequency side and the high frequency side. When compared the extents of the energy reduction, since the high frequency side Tr 2 is longer than the low frequency side Tr 1 as for a distance L between the input side tapered IDT electrode 102 and the output side tapered IDT electrode 103, regarding to dTr which shows degree of the track shifting, dTr 2 is larger than dTr 1, which results in larger attenuation amount in energy on the high frequency side.

Further, diffraction of the elastic wave radiated from the end of the input side tapered IDT electrode 102 occurs, which leads to loss based on the diffraction in the energy propagation between the input side tapered IDT electrode 102 and the out put side tapered IDT electrode 103. Then also, the longer the distance L between the input side tapered IDT electrode 102 and the output side tapered IDT electrode 103, the greater the diffraction loss.

From these circumstances, the energy loss due to refraction or diffraction gives large influence to the high frequency side characteristics having a long propagation distance L, and therefore, attenuation characteristics on the high frequency side are deteriorated as shown by "B" in FIG. 15.

Further, shown as Tr 0 (the side having a frequency lower than Tr 1) in FIG. 14, there is an elastic wave propagating to an area out of the area in which the output side tapered IDT electrode 103 is formed due to the refraction among the elastic waves radiated from the input side tapered IDT electrode 102. Since such an elastic wave is not received at the output side tapered IDT electrode 103, the attenuation characteristics is deteriorated even on the low frequency side.

In the meantime, in such a filter 100, in order to enhance the selectivity, in other words, in order to give a steep leading edge of a pass band in a frequency characteristic chart, a method of increasing a logarithm of the electrode finger 106 is adopted in general. Accordingly, the inclination angle θ of the electrode finger 106 is increased further, and deterioration of the above-described attenuation characteristics is more remarkable.

Concluding above, there are following problems.

Since a tapered IDT is inclined, the attenuation characteristics are deteriorated from a low frequency side to a high frequency side, and the extent of deterioration is great on a high frequency side in particular. When the filter 100 is made to have a higher frequency band, and when the logarithm of the electrode finger 106 is increased, the inclination angle θ increases, which makes such deterioration remarkable. In addition, when the logarithm of the electrode finger 106 is increased, there arises another problem of enlarging the size of the filter 100.

The above-described problems are found in Patent Document 1, but there is no suggestion on a technology to suppress refraction or diffraction of the elastic waves.

Patent Document 1

Japanese Patent Application Laid-open No. 2005-150918 ((0004), (0022) to (0025))

SUMMARY OF THE INVENTION

The present invention has been achieved under the above-described circumstances, and an object thereof is to provide a technology capable of suppressing deterioration of attenuation characteristics due to refraction or the like of elastic waves and still reducing loss in an elastic wave filter formed with a tapered IDT.

The elastic wave filter of the present invention including:

an input side tapered IDT electrode which includes a pair of bus bars formed in parallel to each other and electrode fingers extending from each of the pair of bus bars to be shaped in comb teeth, and which is formed in a manner that the width of the electrode finger and a space area between the electrode fingers are widened gradually from one bus bar toward the other bus bar;

an output side tapered IDT electrode being disposed separately from the input side tapered IDT electrode with a space in the direction of propagation of the elastic wave, which includes a pair of bus bars formed in parallel to each other and electrode fingers extending from each of the pair of bus bars to be shaped in comb teeth, and which is formed in a manner that the width of the electrode finger and a space area between the electrode fingers are widened gradually from the one bus bar toward the other bus bar;

a short grating electrode provided between the input side tapered IDT electrode and the output side tapered IDT electrode;

arranging the one bus bar of the input side tapered IDT electrode and the one bus bar of the output side tapered IDT electrode in the direction of propagation of the elastic wave; and forming an arrangement pattern of the electrode fingers in the short grating electrode in a manner that the arrangement pattern of the electrode fingers of at least either the input side tapered IDT electrode or the output side tapered IDT electrode is continuously extended.

It is preferable that the arrangement pattern of the electrode fingers in the short grating electrode is formed in a manner that the arrangement pattern of the electrode fingers of the input side tapered IDT electrode and the arrangement pattern of the electrode fingers of the output side tapered IDT electrode are continuously extended respectively, and both electrode fingers of the respective arrangement patterns are connected at an intersecting part of these arrangement patterns.

The arrangement pattern of the electrode finger in the short grating electrode is formed in a manner that one of the arrangement patterns of the electrode finger out of the input side tapered IDT electrode and the output side tapered IDT electrode is continuously extended, and an extended end of this arrangement pattern and the other end of the input side tapered IDT electrode and the output side tapered IDT electrode on the short grating electrode side may be separated from each other.

The present invention may be configured, for instance, as follows.

Supposing a cycle unit of the arrangement pattern of the electrode finger corresponding to a wavelength of the elastic wave propagating in a track being a propagation path of the elastic wave to be λ, it is preferable that a) distances between center lines of the electrode fingers adjacent to each other of the input side tapered IDT electrode, the short grating electrode, and the output side tapered IDT electrode;

b) distance between the center line of the electrode finger at the end of the input side tapered IDT electrode on the short grating electrode side and the center line of the electrode finger of the short grating electrode on the input side tapered IDT electrode side; and c) distance between the center line of the electrode finger of the output side tapered IDT on the short grating electrode side and the center line of the electrode finger of the short grating electrode on the output side tapered IDT electrode side, are all λ/4.

A part of the electrode fingers of the short grating electrode may be a reflection source of the elastic wave, of which width is set to be ¼ of the above-described λ or less.

In the elastic wave filter provided with a short grating electrode between the input side tapered IDT and the output side tapered IDT, the present invention forms an arrangement pattern of the short grating electrode in a manner that the arrangement pattern of at least one electrode fingers out of the input side tapered IDT and the output side tapered IDT is continuously extended. Accordingly, a part of the short grating electrode which succeeds the arrangement pattern of the electrode fingers of the input side tapered IDT electrode acoustically becomes the same medium as the input side tapered IDT electrode, and a part of the short grating electrode which succeeds the arrangement pattern of the electrode fingers of the output side tapered IDT electrode becomes the same medium as the output side tapered IDT electrode. Accordingly, a border part of the input side and the output side is only one place, which makes the extent of refraction or the like of the elastic wave small, so that it becomes possible to suppress the deterioration of the attenuation characteristics.

DETAILED DESCRIPTION OF THE PREFERRED EMBODIMENT(S)

Figure 13:
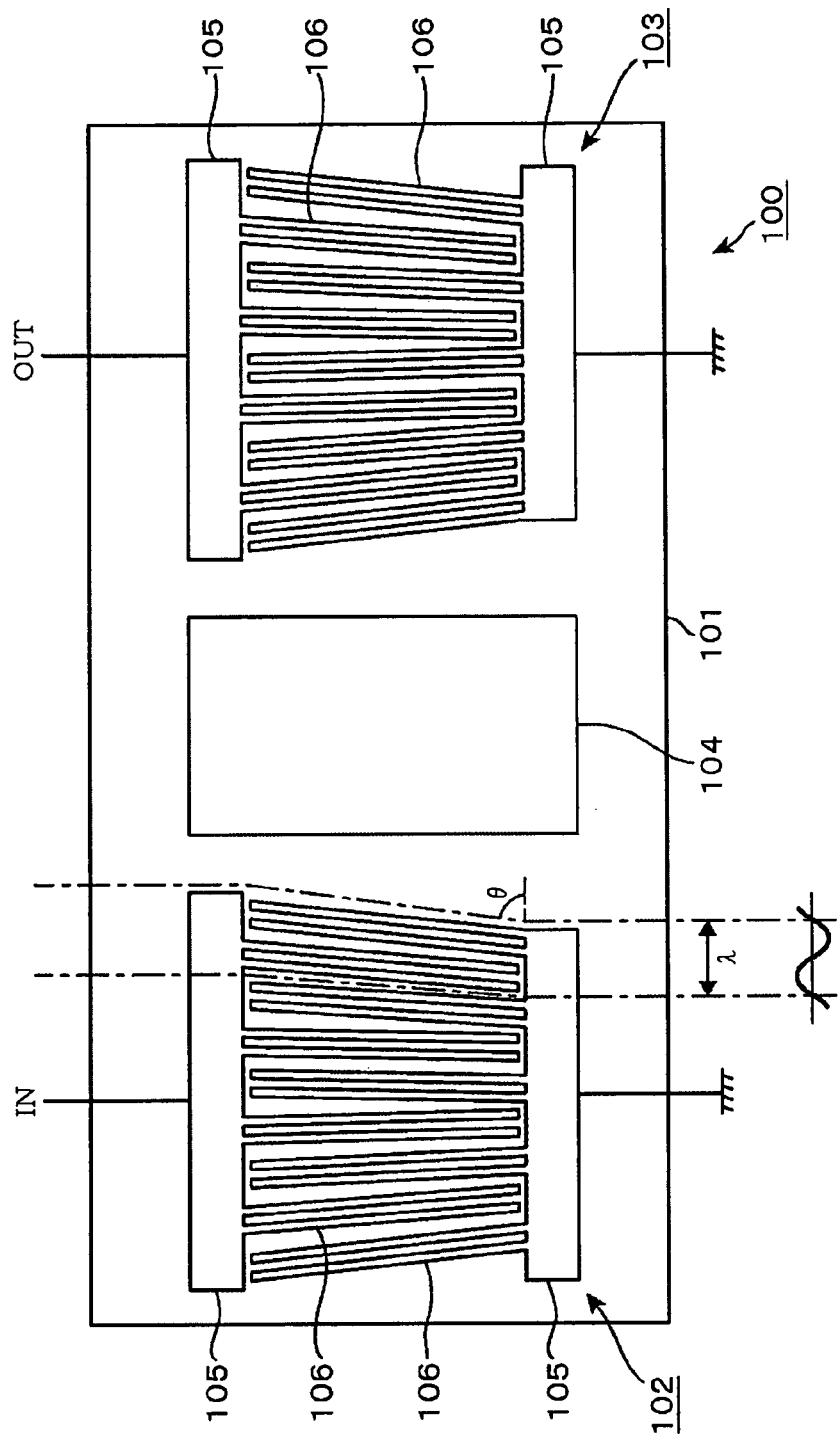
FIG. 13 is a plan view showing a conventional elastic filter.
Figure 14:
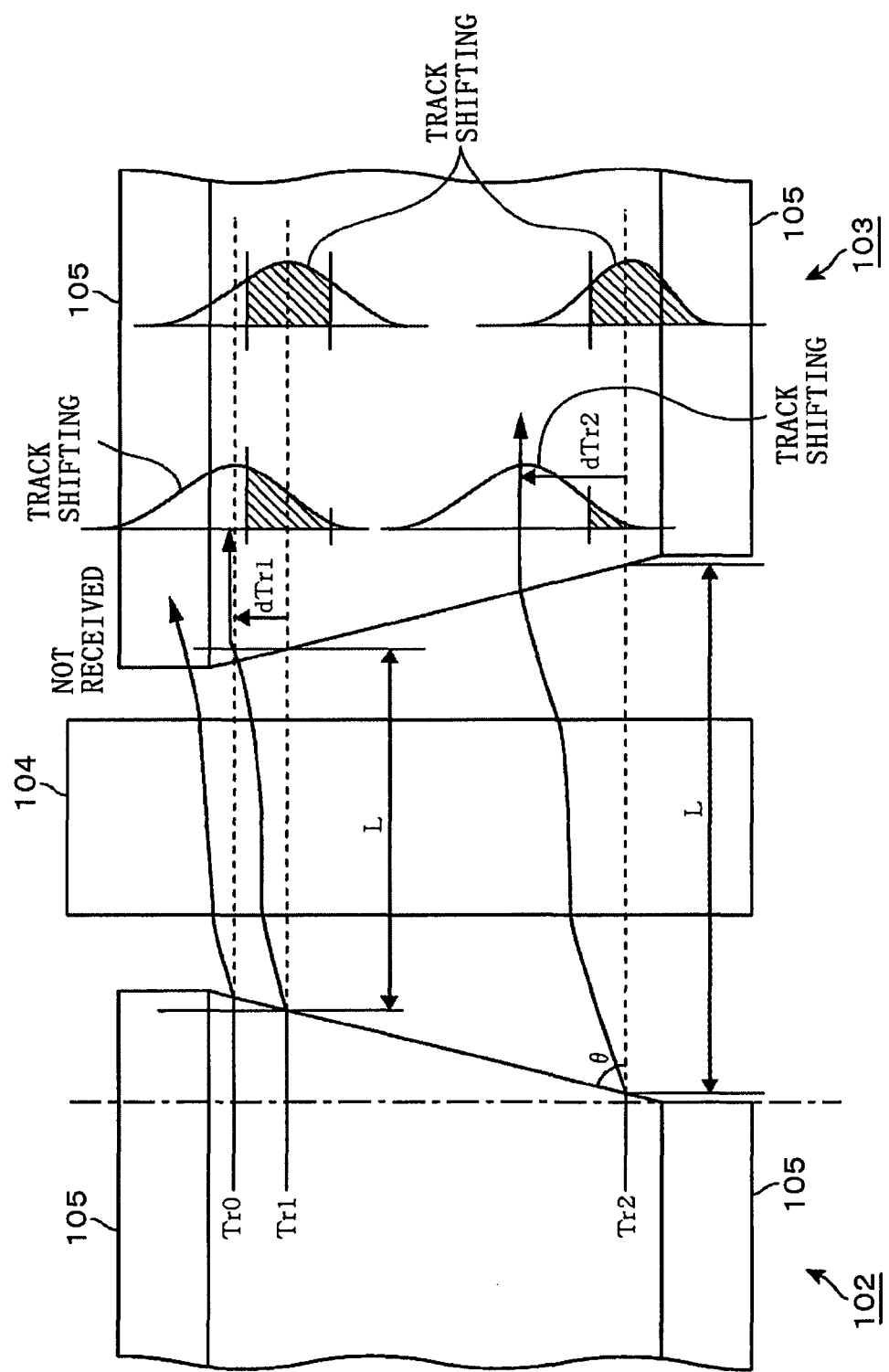
FIG. 14 is a schematic diagram showing a manner of propagating elastic waves in the conventional elastic wave filter.

Embodiments of the present invention will be explained referring to FIG. 1 to FIG. 5. An input side tapered IDT electrode 12 and an output side tapered IDT electrode 13 having the same structure as an input side tapered IDT electrode 102 and an output side tapered IDT electrode 103 (previously-described in the previous chapter) of a filter 100 shown in FIG. 13 are formed on the surface of a piezoelectric substrate 11 in an elastic wave filter 10 of the present invention. The input side tapered IDT electrode 12 and the output side tapered IDT electrode 13 are disposed in the direction of propagation of the elastic wave leaving a space between them.

In the input side tapered IDT electrode 12, 14a and 14b are one bus bar and the other bus bar respectively and formed in parallel to each other. The one bus bar 14a is connected to an input port 21, and the other bus bar 14b is grounded.

"15" is an electrode finger in the input side tapered IDT electrode 12. In order to be a SPLIT electrode, the electrode fingers composed of these plural electrode fingers 15 are formed such that two pieces of fingers are paired into a set and arranged alternately to be a comb-teeth like shape. In other words, one set is formed so as to extend from the one bus bar 14a toward the confronting other bus bar 14b. The other bus bar 14b which is adjacent to the above-described one bus bar is formed so as to extend from the other bus bar 14b toward one bus bar 14a.

Figure 2:
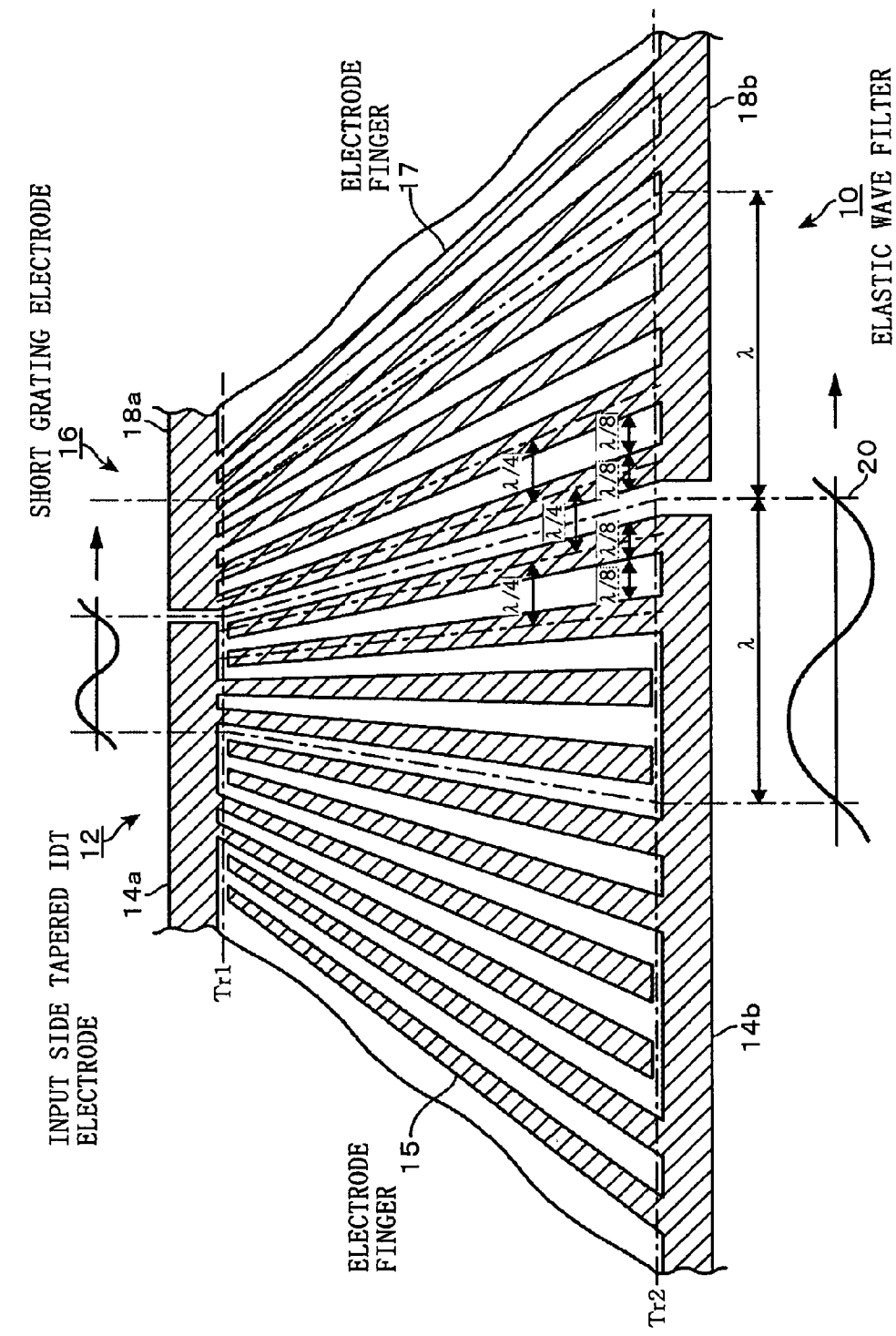
FIG. 2 is an enlarged plan view of a part of the elastic wave filter.

In relation to the direction of propagation of the elastic wave, as shown also in FIG. 2, the electrode fingers 15 are formed in a manner that the width and space between the electrode fingers 15 and 15 have the same and fixed size. Meanwhile, the arrangement pattern of the electrode fingers 15 is formed by taking the sum of a pair of two pieces of the electrode fingers 15 extending from one bus bars 14a and a pair of two pieces of the electrode fingers 15 adjacent to the above-described pair of the electrode fingers 15 and extending from the other bus bars 14b, as a cycle unit $\lambda$ and by repeating this cycle unit. With this elastic wave filter 10, elastic waves having a wavelength the same as the length of the cycle unit $\lambda$ is to be propagated.

In this example, as described above, since the cycle unit $\lambda$ is formed with four pieces of electrode fingers 15, in more detail, four electrode fingers 15 and four space areas between the electrode fingers 15 and 15, as for the adjacent electrode fingers 15 and 15, the size between straight lines (axial line) passing through the center of the electrode finger 15 is $\lambda/4$. Also in the example, since the width of the electrode finger 15 is $\lambda/8$, the distance between the electrode fingers 15 and 15 is also $\lambda/8$ ($\lambda/4 - \lambda/8 = \lambda/8$).

In this arrangement pattern, the space (pitch) between the electrode fingers 15 is gradually widened in the direction perpendicular to the direction of propagation of the elastic wave from the upper side toward the lower side in the drawing. The respective widths of the electrode fingers 15 are also gradually widened from the upper side toward the lower side. Accordingly, a track Tr 1 which is the smallest cycle unit $\lambda$ is formed on the bus bar 14a side, and at the same time, a track Tr 2 which is the largest cycle unit $\lambda$ is formed on the bus bar 14b side. Then, an infinite number of tracks are in existence between these tracks Tr 1 and Tr 2, where the cycle unit $\lambda$ is getting larger as the track goes toward the track Tr 2 side. In other words, in the direction perpendicular to the direction of propagation of the elastic wave, the tracks which are propagation paths of the elastic wave are formed over a wide frequency band from Tr 1 which is an area where the cycle unit $\lambda$ is narrow to Tr 2 which is an area where the cycle unit $\lambda$ is wide. Note that in FIG. 1, the width of the electrode finger 15 is depicted as having a fixed width for brevity of illustration.

Figure 1:
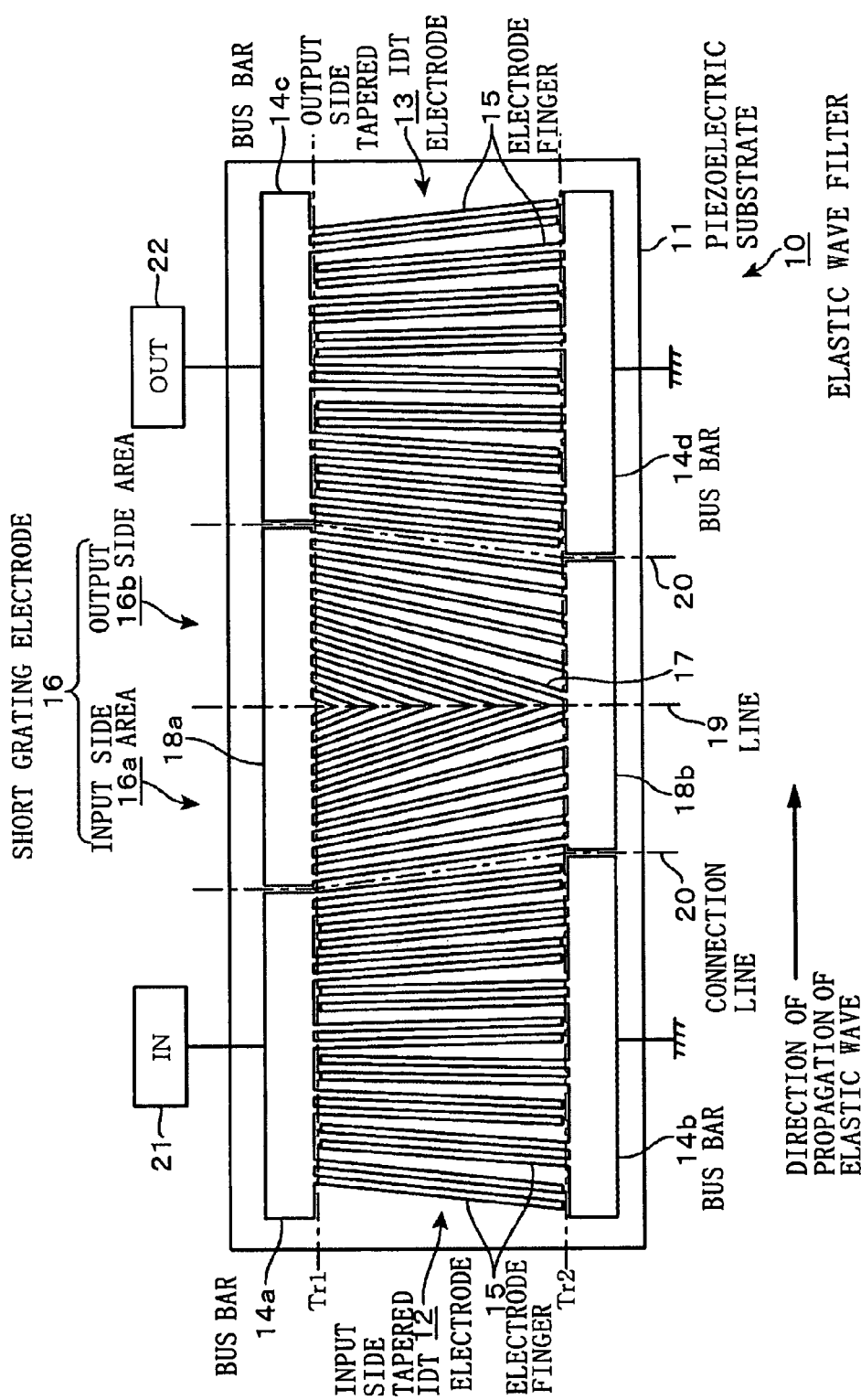
FIG. 1 is a plan view showing an example of elastic wave filters relating to an embodiment of the present invention.

As shown in the FIG. 1, the output side tapered IDT electrode 13 is provided with one bus bar 14c and the other bus bar 14d similarly to the input side tapered IDT electrode 12. The one bus bar 14c is connected to an output board 22, and the other bus bar 14d is grounded. The output side tapered IDT electrode 13 is provided with the electrode finger 15 arranged to be an arrangement pattern, in which, similarly to the input side tapered IDT electrode 12, the frequency unit $\lambda$ is fixed in respect to the direction of propagation of the elastic wave, and the frequency unit $\lambda$ is widened from Tr 1 to Tr 2 from the upper side toward the lower side in respect to the direction perpendicular to the direction of propagation of the elastic wave. The arrangement pattern and the size of the electrode fingers 15 of the output side tapered IDT electrode 13 are formed to be the same as the arrangement pattern in the previously-described input side tapered IDT electrode 12.

Between the input side tapered IDT electrode 12 and the output side tapered IDT electrode 13, a short grating electrode 16 is formed as shown in FIG. 1 and FIG. 2, and the short grating electrode 16 is provided with a pair of one bus bar 18a and the other bus bar 18b which are parallel to each other. Between these bus bars 18a and 18b, a plurality of electrode fingers 17 extending in the direction nearly perpendicular to the direction of propagation of the elastic wave (in more detail, to be slant to the perpendicular direction) are formed, similarly to the previously-described electrode finger 15. The electrode finger 17 is connected to the bus bars 18a and 18b respectively at one end side and the other end side.

The arrangement of the electrode fingers 17 in the direction of propagation of the elastic wave is formed in a manner that the electrode finger 17 and the space (pitch) of the arrangement of the electrode fingers 17 have the same and fixed size, and, similarly to the electrode finger 15, the arrangement pattern composed of the electrode fingers 17 and the spaces of the arrangement of the electrode fingers 17 is formed to be a repeat of the fixed cycle unit λ. As advancing from one bus bar 18a to the other bus bar 18b, it is formed in a manner that the width of the electrode finger 17 and the pitch are widened. The arrangement pattern of the electrode finger 17 will be explained with reference to the already-explained FIG. 2 which shows the vicinity of a border between the input side tapered IDT electrode 12 and the short grating electrode 16 in a magnified view. The cycle unit λ of the electrode fingers 17 is composed of widths and spaces of four electrode fingers, similarly to the arrangement pattern of the electrode fingers 15. The arrangement pattern of the electrode finger in the short grating electrode 16 on the input side tapered IDT electrode 12 side, is formed in a manner that the arrangement pattern of the electrode fingers 15 of the input side tapered IDT electrode 12 is continuously extended. Accordingly, the distance between the center lines of the adjacent electrodes 17 and 17 is λ/4, similarly to the arrangement pattern of the electrode fingers 15. The width and the space of the electrode finger 17 is λ/8 respectively, similarly to the electrode fingers 15.

An area between the input side tapered ITD electrode 12 and the short grating electrode 16 is set such that the distance between the center line of the electrode finger 15 at the end of the input side tapered IDT electrode 12 on the short grating electrode 16 side, and the center line of the electrode finger 17 of the short grating electrode 16 on the input side tapered IDT electrode 12 side is λ/4. Through this configuration, at a connection line 20 extending in the direction nearly perpendicular to the direction of propagation of the elastic wave on the border between these center lines, the cycle unit λ of the input side tapered IDT electrode 12 and the cycle unit λ of the short grating electrode 16 are connected continuously without breaking. In the short grating electrode 16, an area formed so as to continue from the input side tapered IDT electrode 12 is an input side area 16a.

As shown in the FIG. 1, on the output side tapered IDT electrode 13 side, the arrangement pattern of the short grating electrode 16 is formed as if the arrangement pattern of the output side tapered IDT electrode 13 is extended so that an output side area 16b is formed. Also, the distance between the center line of the electrode finger 15 of the output side tapered IDT electrode 13 on the short grating electrode 16 side, and the center line of the electrode finger 17 of the short grating electrode 16 on the output side tapered IDT electrode 13 side is set to be λ/4. Through this configuration, the cycle unit λ of the short grating electrode 16 and the cycle unit λ of the output side tapered IDT electrode 13 are connected continuously at the connection line 20 without breaking. The width and the space of the electrode finger 17 in the output side area 16b is set similarly to those in the input side area 16a.

The output side area 16b and the previously-described input side area 16a are connected along a line 19 passing through nearly the center of the short grating electrode 16 and extending in the direction perpendicular to the direction of propagation of the elastic wave.

Note that the width of the electrode finger 17 is depicted in FIG. 1 as having a fixed width for brevity of illustration. As for FIG. 2, oblique lines are attached to the input side tapered IDT electrode 12 and the short grating electrode 16 for the purpose of easy discrimination.

Figure 3:
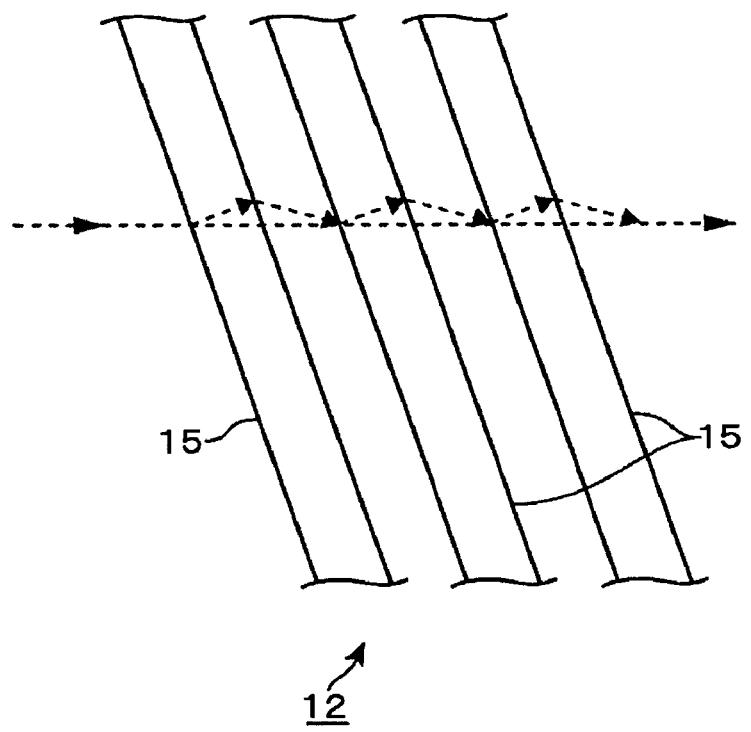
FIG. 3 is a plan view schematically showing a propagation course of the elastic wave filter.

In such an elastic wave filter 10, when a frequency signal is input into the input side tapered IDT electrode 12, in other words, when the frequency signal is input between the input port 21 and the ground, surface acoustic waves (SAW) which are acoustic waves are generated. In the input side tapered IDT electrode 12, this elastic wave propagates to the output side tapered IDT electrode 13 side on the track in which the cycle unit λ corresponding to the length (λ) of its wave length is formed. Although this elastic wave repeats refraction whenever the wave goes in and comes out to/from the electrode finger 15, since the shape of the respective electrode fingers 15 and the shape of the space areas (arrangement pattern) are fixed, the elastic wave propagates roughly linearly as shown in FIG. 3.

In the short grating electrode 16, since the arrangement pattern of the electrode fingers 15 of the input side tapered IDT electrode 12 is succeeded, the elastic wave propagates linearly when it launches from the input side tapered IDT electrode 12 into the short grating electrode 16, and also in the short grating electrode 16.

In the short grating electrode 16, since the line 19 which is a border part of the input side area 16a to which the arrangement pattern of the input side tapered IDT electrode 12 is succeeded and the output side area 16b to which the arrangement pattern of the output side tapered IDT electrode 13 is succeeded is a surface of discontinuity, the elastic wave refracts a little on the line 19, but the extent of refraction is very small. Accordingly, the elastic wave propagated from the input side tapered IDT electrode 12 via the input side area 16a propagates to the output side area 16b nearly linearly.

Thereafter, similarly, the elastic wave propagates from the output side area 16b to which the arrangement pattern of the output side tapered IDT electrode 13 is succeeded to the output side tapered IDT electrode 13 in a state that refraction or diffraction is suppressed.

Figure 4:
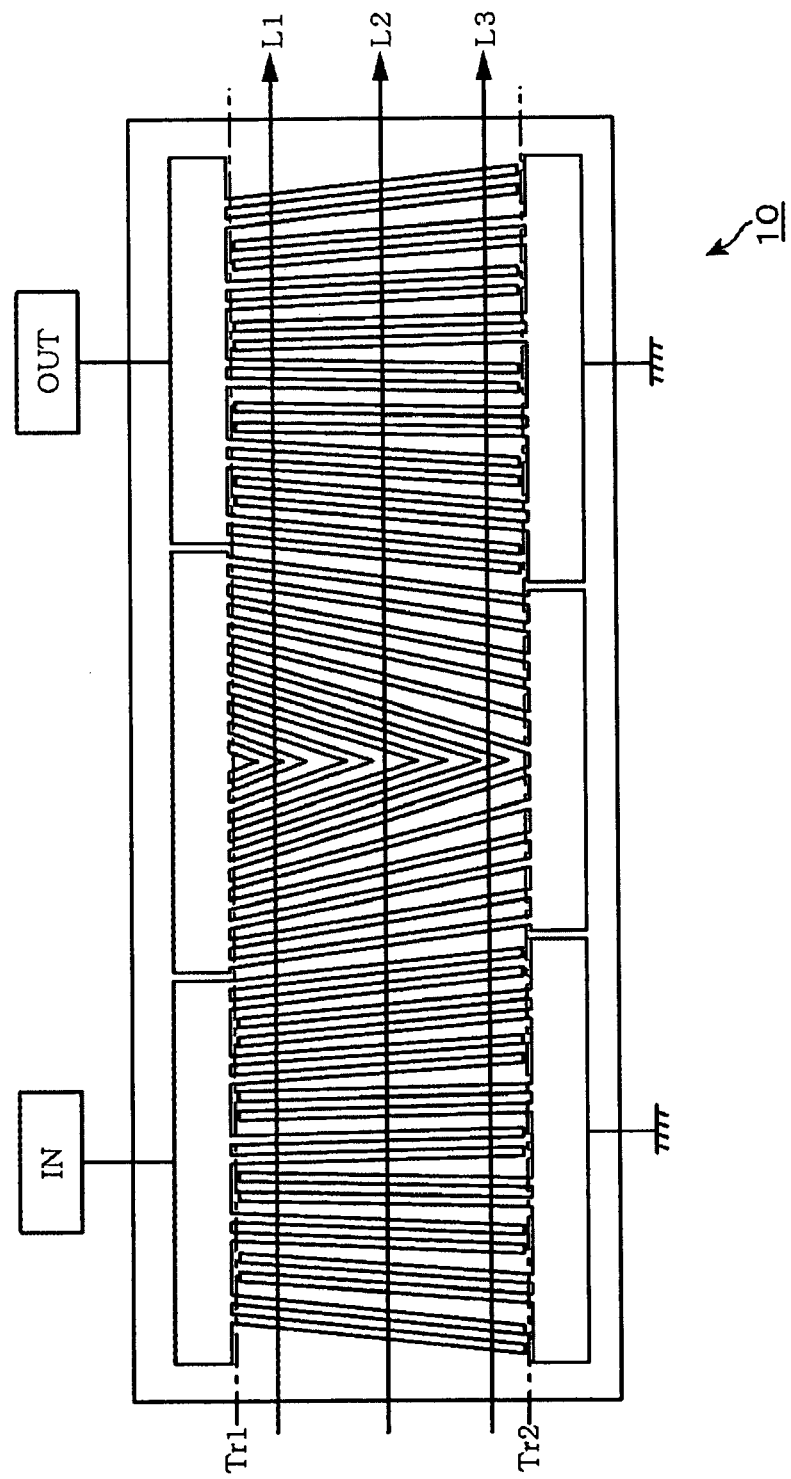
FIG. 4 is a schematic diagram showing a manner of propagation of the elastic wave in the elastic wave filter.
Figure 5:
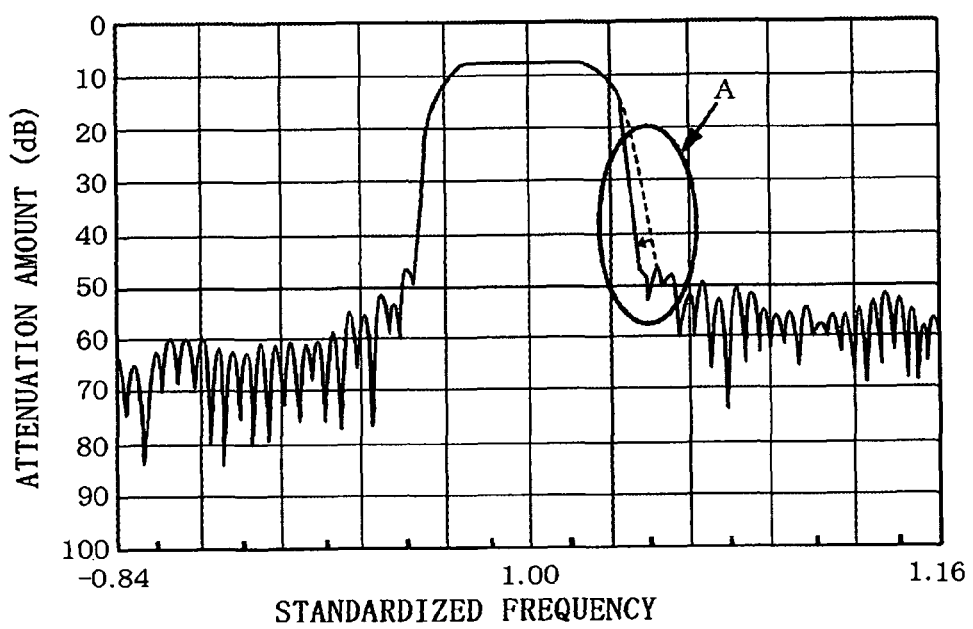
FIG. 5 is a characteristic diagram showing attenuation characteristics of frequency in the elastic wave filter.

Accordingly, as shown in FIG. 4, the elastic wave radiated from the input side tapered IDT electrode 12 is to arrive at the output side tapered IDT electrode 13 in a state that deviation from the track is suppressed over the wide frequency band. Note that linear lines L1, L2 and L3 in the drawing show propagation courses (track) of the elastic waves propagating at every three positions along the length direction of the electrode fingers 15 and 17. In this case, the wavelength becomes longer in the order of L1<L2<L3. In the elastic wave filter 10, actually, tracks corresponding to respective wavelengths between the minimum track Tr 1 and the maximum track Tr 2 of the electrode fingers 15 and 17 exist. Then, electric signals corresponding to the elastic waves of the respective tracks are output.

According to the above-described embodiment, the short grating electrode 16 is formed with a plurality of the electrode fingers 17, not with a metal solid film, and the input side area 16a of the short grating electrode 16 adjacent to the input side tapered IDT electrode 12 and the output side area 16b close to the output side tapered IDT electrode 13 are formed to have a pattern continuous (as if being extended) from the input side tapered IDT electrode 12 and the output side tapered IDT electrode 13 respectively. As described above, an area between the input side tapered IDT electrode 12, the output side tapered IDT electrode 13 and the short grating electrode 16 is set in a manner that the cycle unit λ which is a repeat unit of the electrode fingers 15 and 17 continues without breaking.

Figure 15:
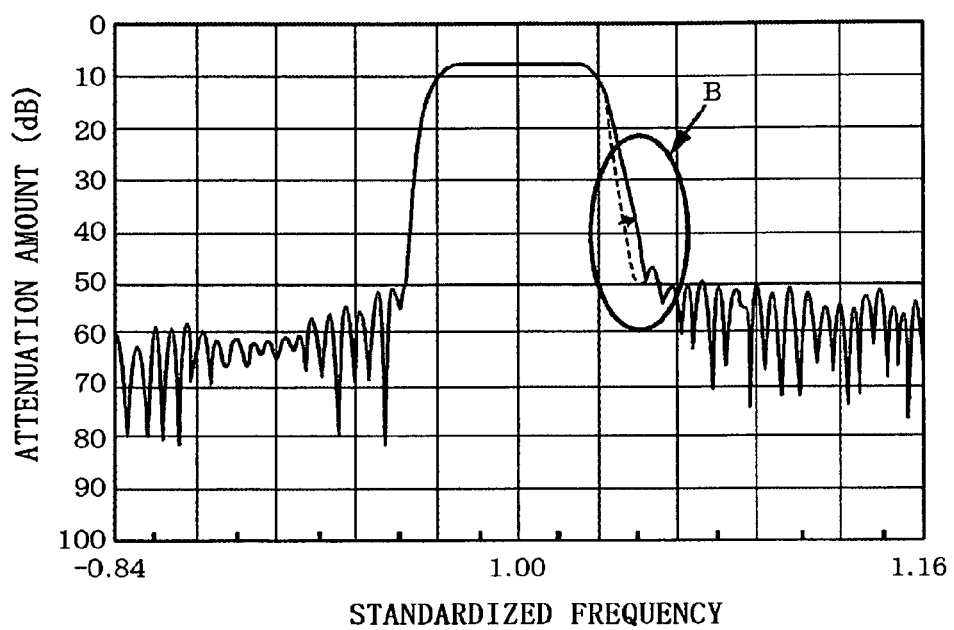
FIG. 15 is a characteristic diagram showing the attenuation characteristics of frequency in the conventional elastic wave filter.

From this, the elastic wave filter 10 is outwardly formed from the input side tapered IDT electrode 12 and the output side tapered IDT electrode 13, and a cycle structure is formed such that a bordering part between the input side tapered IDT electrode 12 and the output side tapered IDT electrode in the respective tracks, in other words, a part having no cycle structure is only one part, the line 19. Accordingly, since the extent of refraction or diffraction of the elastic wave becomes small as well as reflection, it is possible to reduce the energy loss of the elastic wave in the respective tracks. As a result, as shown by "A" in FIG. 5, the attenuation characteristics becomes favorable, and the attenuation characteristics especially on a high frequency side can be made favorable. In addition, a shape factor (the ratio of 35 dB band width to 1 dB band width) is 1.70 in the present invention (FIG. 5), which is a very favorable value, it is 1.81 conventionally (FIG. 15). Furthermore, since the attenuation characteristics becomes favorable even without increasing the logarithm of the electrode finger 15, the present invention has a merit of downsizing of the elastic wave filter 10. When the logarithm of the electrode finger 15 is increased, it is possible to enhance selectivity, while suppressing deterioration of the attenuation characteristics.

Note that though an illustration by drawings is omitted in the above-described examples, it is preferable to provide a reflector in an outside area of the input side tapered IDT electrode 12 or the output side tapered IDT electrode 13 (the area on the opposite side of the short grating electrode 16).

Figure 6:
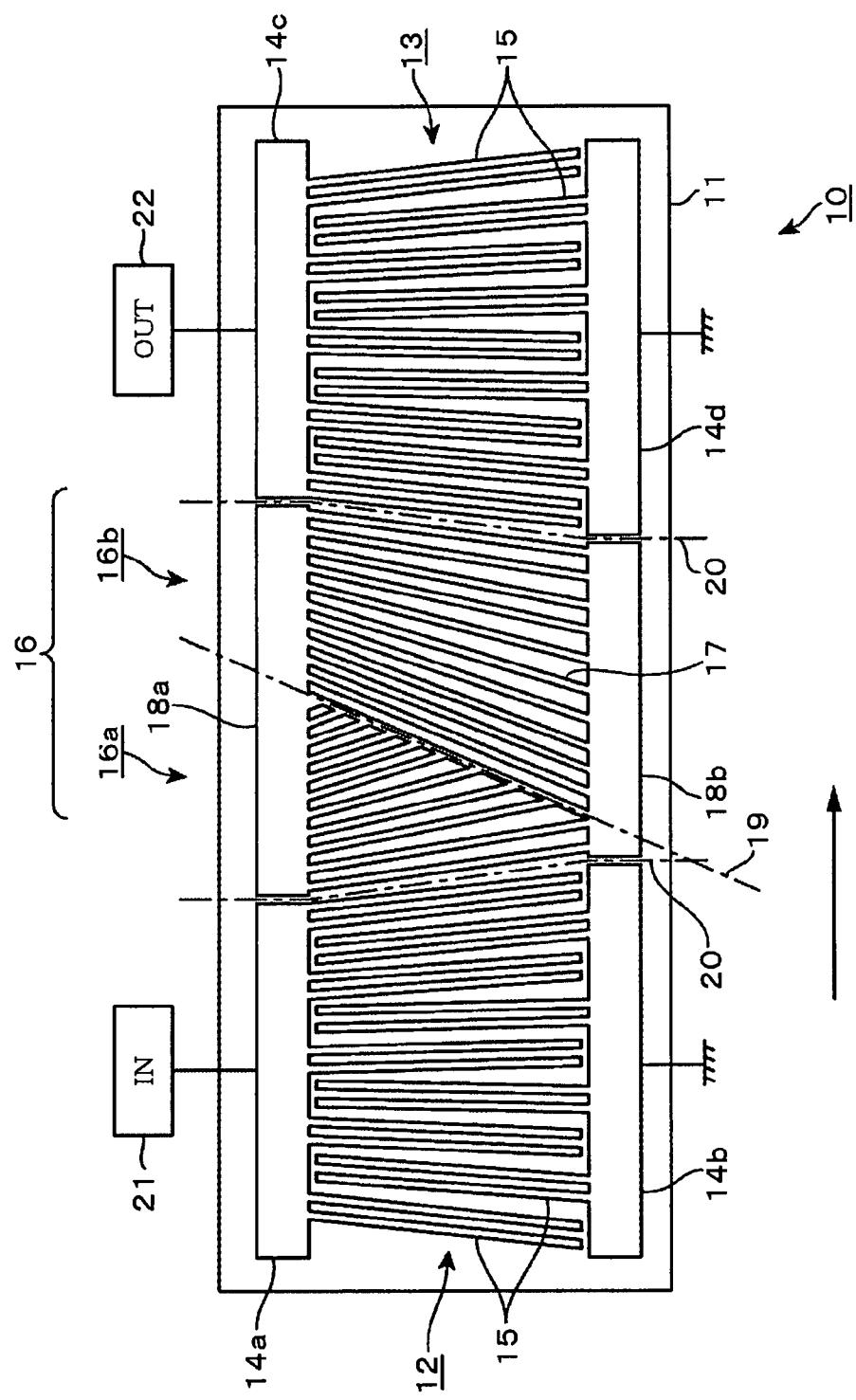
FIG. 6 is a plan view showing another example of the elastic wave filter.

Although the input side area 16a and the output side area 16b are formed in a manner that the line 19 is formed at the center part of the short grating electrode 16 in this example, for instance, it is also acceptable that either the input side area 16a or the output side area 16b is made larger so that the line 19 inclines toward the direction of propagation of the elastic wave (refer to FIG. 6).

Figure 7:
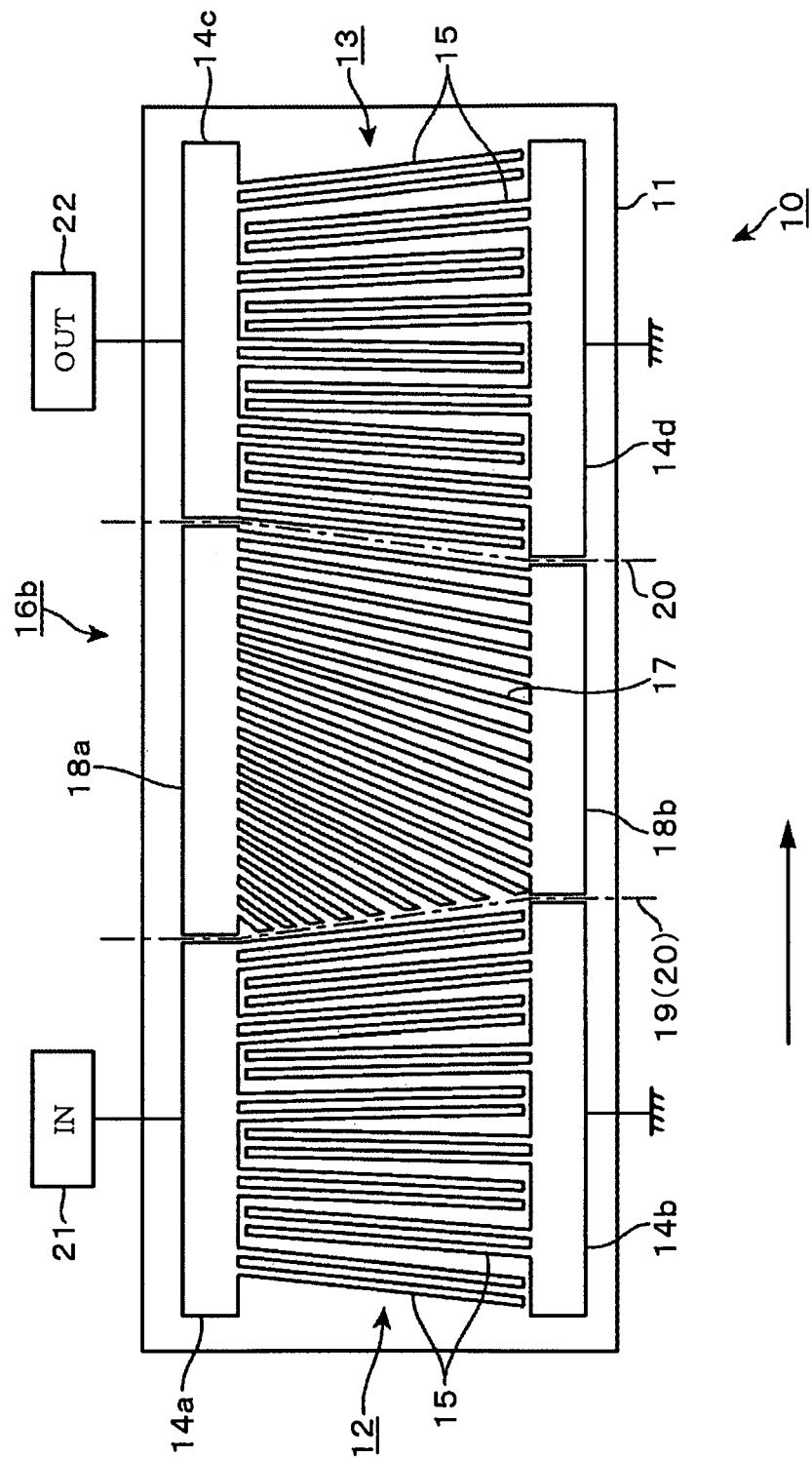
FIG. 7 is a plan view showing still another example of the elastic wave filter.
Figure 8:
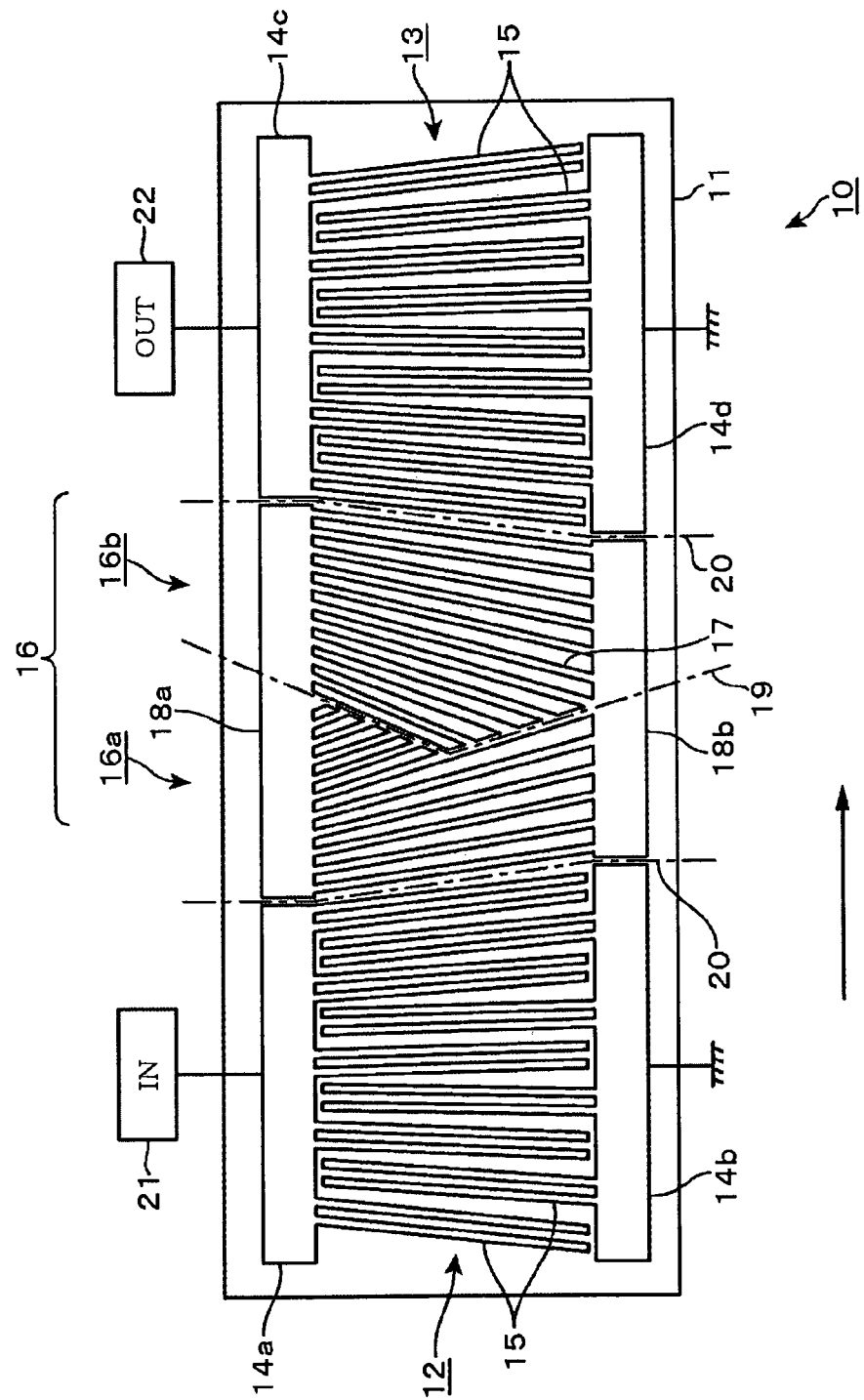
FIG. 8 is a plan view showing yet another example of the elastic wave filter.
Figure 9:
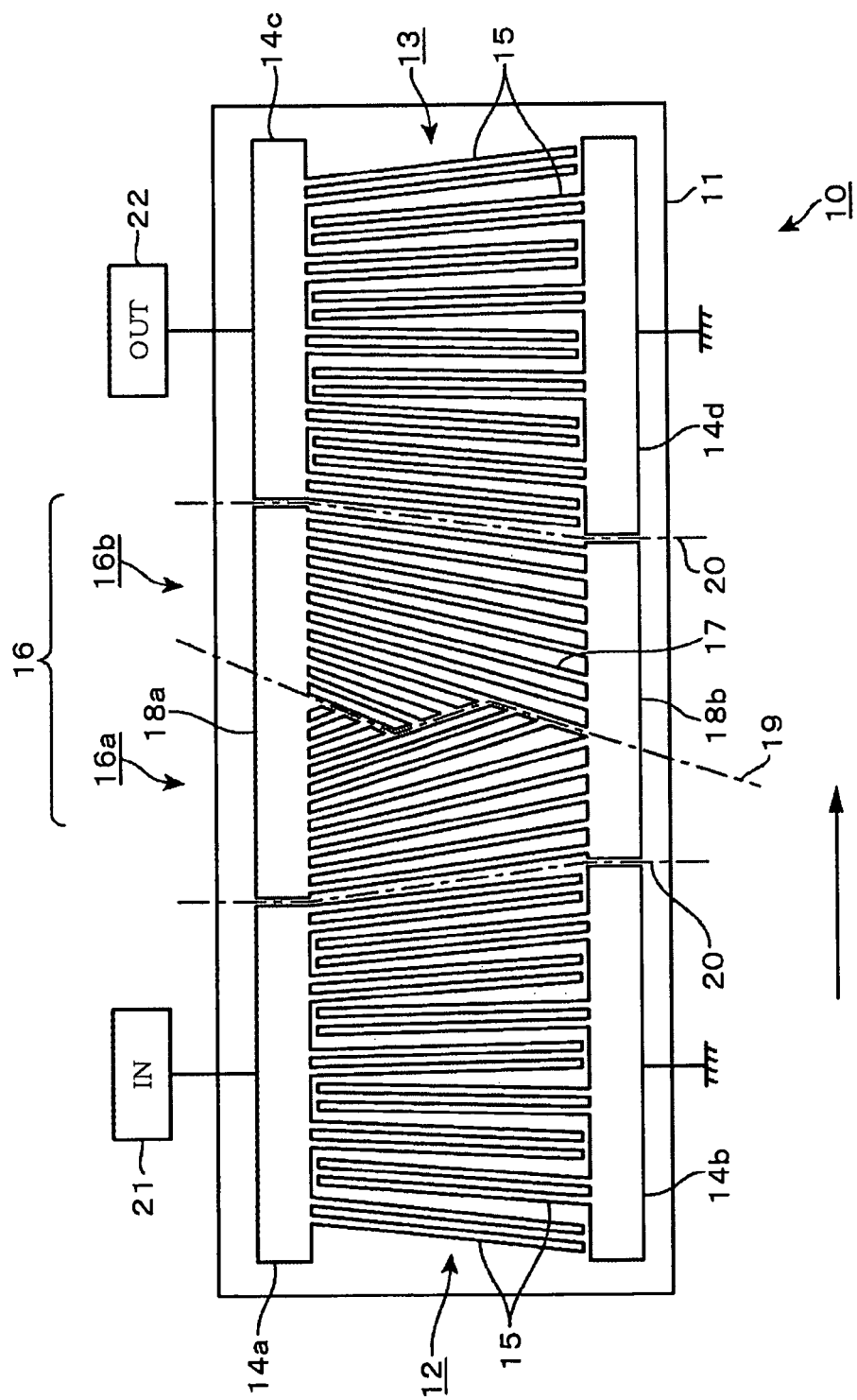
FIG. 9 is a plan view showing another example of the elastic wave filter.

It is also possible to form the short grating electrode 16 with either the input side area 16a or the output side area 16b only. FIG. 7 shows an example of such an elastic wave filter 10, and the line 19 is outwardly formed between the input side tapered IDT electrode 12 and the short grating electrode 16 in this case. Further, as shown in FIG. 8, the line 19 may be bent at some midpoint, or as shown in FIG. 9, the line 19 may be bent at a plurality of points, for instance, at two points. In other words, it is satisfactory that a surface of discontinuity (line 19) through which the propagating elastic wave passes is designed to be one in the respective tracks.

With the elastic wave filter 10 in this configuration, the same effect as that of the previously-described examples (FIG. 1) can be obtained.

Figure 10:
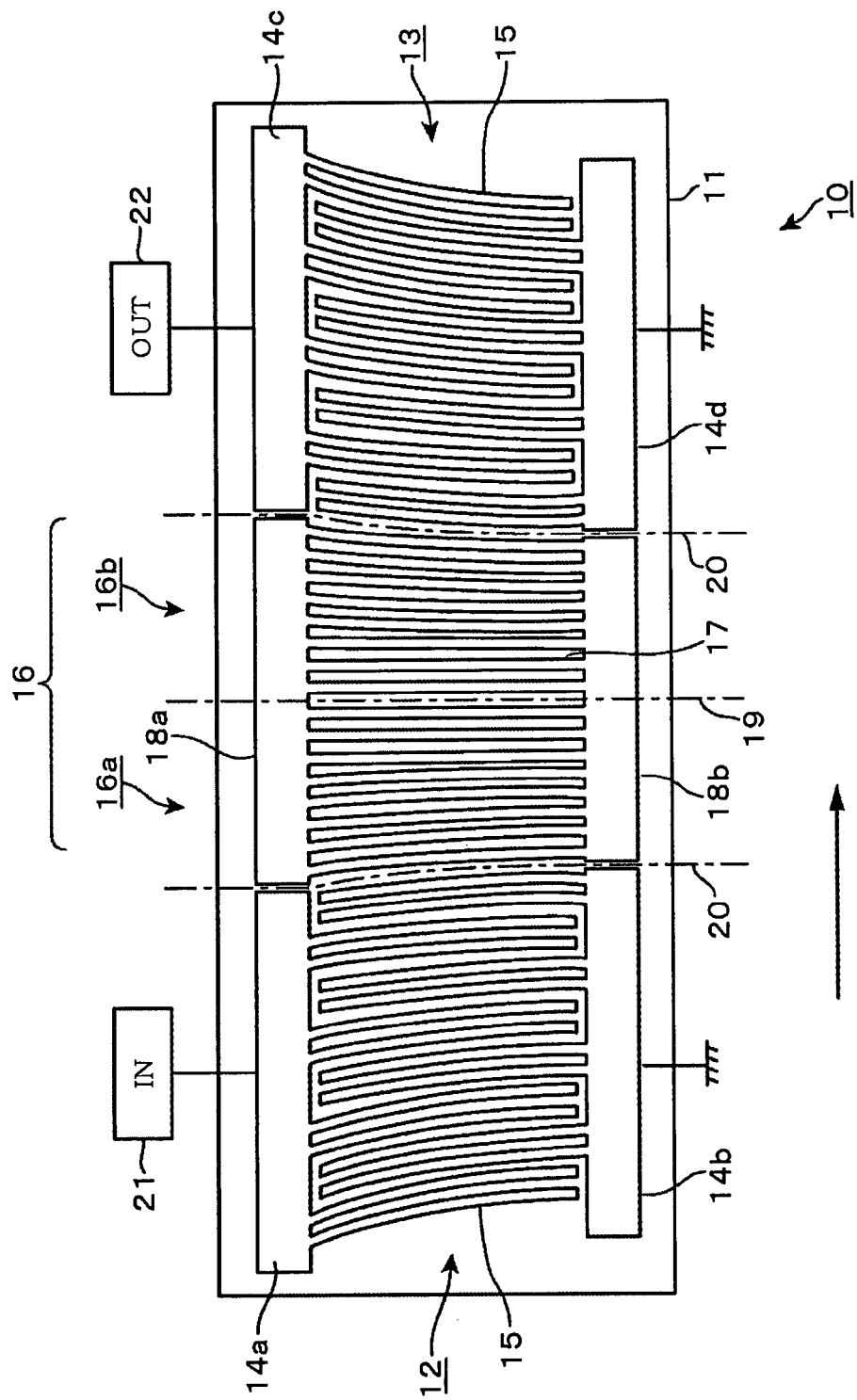
FIG. 10 is a plan view showing still another example of the elastic wave filter.
Figure 11:
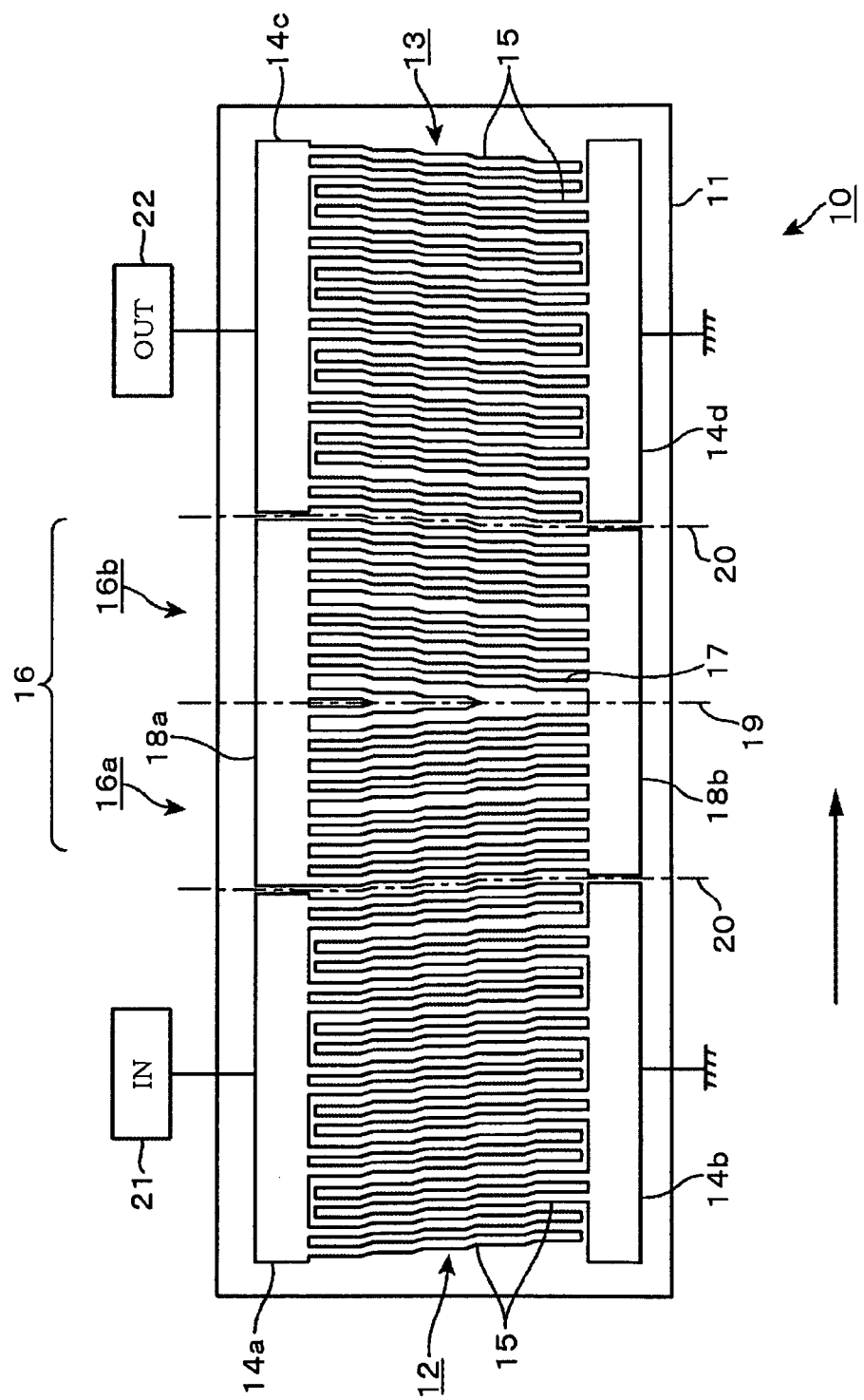
FIG. 11 is a plan view showing yet another example of the elastic wave filter.

Although the respective electrode fingers 15 and 17 are continuously and linearly widened as shown in the respective examples, they may be widened in a curve as shown in FIG. 10, or, they may be widened in stages for instance, as shown in FIG. 11, so that it is formed in a so-called pseudotapered form. Note that also in FIGS. 10 and 11, the arrangement patterns composed of the widths and the space areas of the respective electrode fingers 15 and 17 are also arranged to get wider from the upper side toward the lower side in the drawing similarly to the respective examples described above, they are omitted for the purpose of simplification of illustration.

Although the width of the electrode fingers 15 and 17, and the spaces between the electrode fingers 15 (17) and 15 (17) are set to be λ/8 respectively in the above examples, it is also possible to set them to be other than λ/8. In such a case, the electrode fingers 15 and 17 can be formed such that the size between straight lines passing the centers of the adjacent electrode fingers 15 (17) (the sum of the width of the electrode finger 15 (17) and the space between the electrode fingers 15 (17) and 15 (17)) is λ/4.

Figure 12:
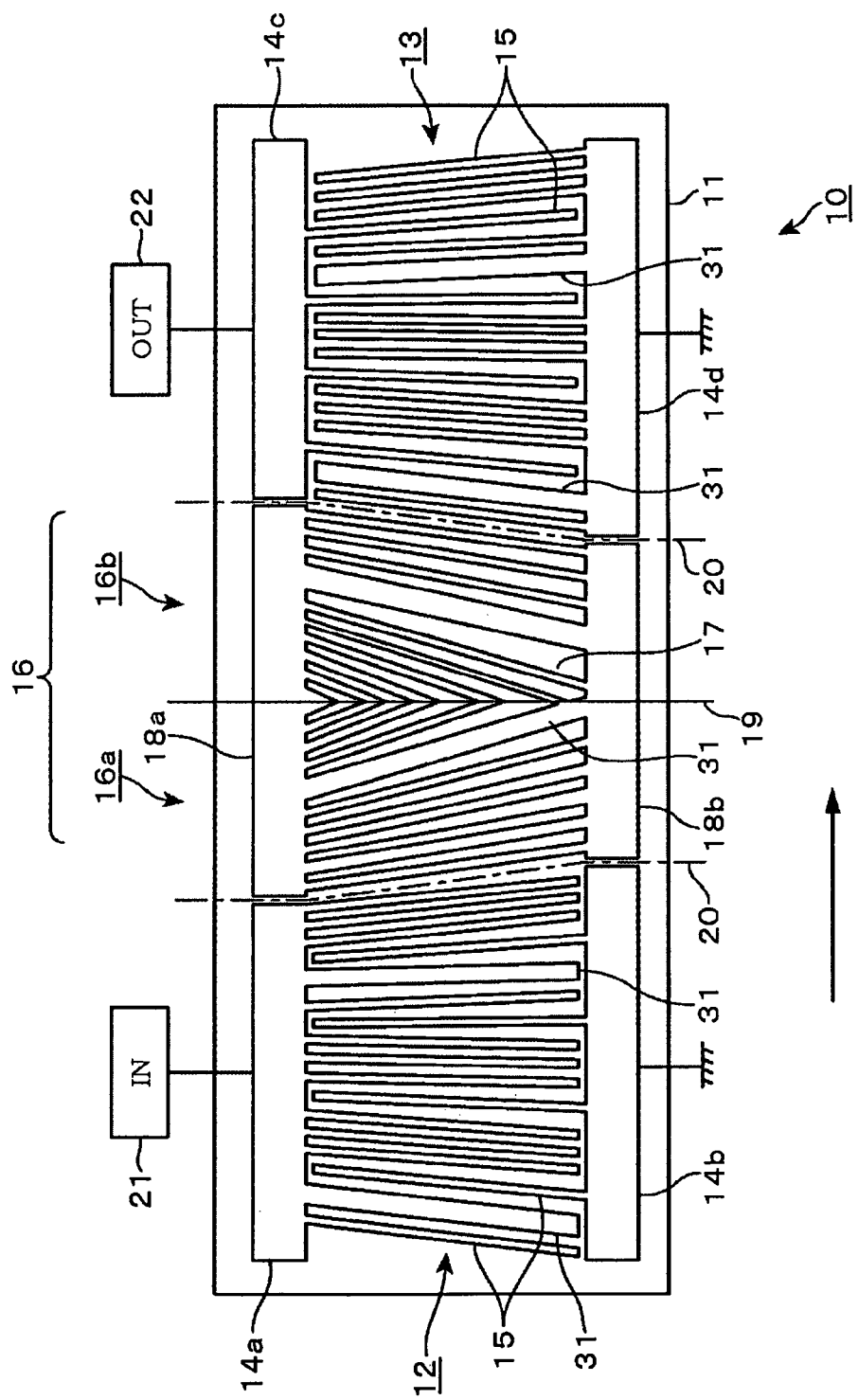
FIG. 12 is a plan view showing another example of the elastic wave filter.

As shown in FIG. 12, it is also possible to provide a reflecting source 31 which is an electrode finger having the width of, for instance, λ/4 or ⅜ λ to the input side tapered IDT electrode 12, output side tapered IDT electrode 13 and the short grating electrode 16 between basic electrode fingers (electrode fingers 15 and 17) having the width of λ/8 so as to form a distributed acoustic reflection transducer (DART) electrode or an electrode width controlled-SPUDT (EWC-SPUDT) electrode. Furthermore, when the electrode fingers 15 in the input side tapered IDT electrode 12 and the output side tapered IDT electrode 13 are connected to both of the bus bars 14a (14c) and 14b (14d) respectively, the width of the reflecting source 31 may be ⅝ λ or less.

In this example, the cycle unit λ is determined, similarly to the above-described example, from four electrode fingers 15 (17) and the space areas between the electrode fingers 15 (17), and the cycle unit λ is composed of a set of one piece of electrode finger 15 extending from one bus bars 14a and 14c and three electrode fingers 15 extending from the other bus bars 14b and 14c adjacent to the one piece of the electrode finger 15 in the input side tapered IDT electrode 12 and the output side tapered IDT electrode 13. Note that FIG. 12 shows an example of providing the reflecting sources 31 to the elastic wave filter 10 in the previously-described FIG. 1.

In the elastic wave filter 10 having such a configuration, the elastic wave is propagating while the energy loss is suppressed similarly, and the same effect as that in the above-described examples can be obtained. With this elastic wave filter 10, it is possible to realize further lowering of the loss and to enhance selectivity by using multiple-reflection aggressively. Furthermore, by providing the reflection source 31, it is possible to realize lowering of the loss without accompanying ripple increase due to a triple transit echo (TTE).

As for a uni-direction electrode, for instance a floating electrode type uni-direction transducer (FEUDT) electrode or a different width split finger-SPUDT (DWSF-SPUDT) electrode or the like is acceptable other than those having such a configuration. Further, any of these uni-direction electrodes can be used as the input side tapered IDT electrode 12 or the output side tapered IDT electrode 13 shown in FIG. 1. Even in such cases, the similar effect as the elastic wave filter 10 in FIG. 12 described above can be obtained.

Although as above-described input side tapered IDT electrode 12 and the output side tapered IDT electrode 13, two pieces of electrode fingers 15 are arranged alternately as a pair to be the SPLIT electrode, one piece of the electrode finger 15 can be arranged alternately so as to be a single electrode.

Note that though a set of the input side tapered IDT electrode 12 and the output side tapered IDT electrode 13 is formed in a pair above the piezoelectric substrate 11 is shown in the above examples, it is also possible to form two pairs or more.

For the filter 10 described above, it is possible to use the elastic wave propagating in the inside from the surface layer of the piezoelectric substrate 11, not to use a surface acoustic wave.

What is claimed is:

1. An elastic wave filter comprising:
an input side tapered IDT electrode which includes a pair of bus bars formed in parallel to each other and electrode fingers extending from each of the pair of bus bars to be shaped in comb teeth, and which is formed in a manner that the width of the electrode finger and a space area between the electrode fingers are widened gradually from one bus bar toward the other bus bar;
an output side tapered IDT electrode being disposed separately from the input side tapered IDT electrode with a space in the direction of propagation of the elastic wave, which includes a pair of bus bars formed in parallel to each other and electrode fingers extending from each of the pair of bus bars to be shaped in comb teeth, and which is formed in a manner that the width of the electrode finger and a space area between the electrode fingers are widened gradually from the one bus bar toward the other bus bar;

a short grating electrode provided between the input side tapered IDT electrode and the output side tapered IDT electrode;

arranging the one bus bar of the input side tapered IDT electrode and the one bus bar of the output side tapered IDT electrode in the direction of propagation of the elastic wave; and forming an arrangement pattern of the electrode fingers in the short grating electrode in a manner that the arrangement pattern of the electrode fingers of at least either the input side tapered IDT electrode or the output side tapered IDT electrode is continuously extended.

2. The elastic wave filter according to claim 1, wherein the arrangement pattern of the electrode fingers in said short grating electrode is formed in a manner that the arrangement pattern of the electrode fingers of said input side tapered IDT electrode and the arrangement pattern of the electrode fingers of said output side tapered IDT electrode are continuously extended respectively, and both electrode fingers of the respective arrangement patterns are connected at an intersecting part of these arrangement patterns.

3. The elastic wave filter according to claim 1, wherein the arrangement pattern of the electrode fingers in said short grating electrode is formed in a manner that one of the arrangement patterns of the electrode fingers of said input side tapered IDT electrode and said output side tapered IDT electrode is continuously extended, and an extended end of this arrangement pattern and the other end of the input side tapered IDT electrode and said output side tapered IDT electrode on said short grating electrode side are separated from each other.

4. The elastic wave filter according to claim 1, wherein supposing a cycle unit of the arrangement pattern of the electrode finger corresponding to a wavelength of the elastic wave propagating in a track being a propagation path of the elastic wave to be $\lambda$, a) distances between center lines of the electrode fingers adjacent to each other of said input side tapered IDT electrode, said short grating electrode, and said output side tapered IDT electrode;

b) distance between the center line of the electrode finger at the end of said input side tapered IDT electrode on said short grating electrode side and the center line of the electrode finger of said short grating electrode on said input side tapered IDT electrode side; and c) distance between the center line of the electrode finger of the output side tapered IDT on the short grating electrode side and the center line of the electrode finger of the short grating electrode on the output side tapered IDT electrode side, are all $\lambda/4$.

5. The elastic wave filter according to claim 1, wherein either of said input side tapered IDT or said output side tapered IDT is a uni-direction electrode.

6. The elastic wave filter according to claim 1, wherein supposing the cycle unit of the arrangement pattern of the electrode fingers corresponding to a wavelength of the elastic wave propagating in a track being a propagation path of the elastic wave to be $\lambda$, a part of the electrode fingers of said short grating electrode is a reflection source of the elastic wave, of which width is set to be ¼ of the $\lambda$ or less.

* * * * *